(12) United States Patent
Ansell et al.

(10) Patent No.: US 7,322,764 B2
(45) Date of Patent: *Jan. 29, 2008

(54) SECURE HOUSING FOR AN ELECTRONIC UNIT

(75) Inventors: Iain Ansell, Newmarket (GB); Adrian Cooper, St. Ives (GB)

(73) Assignee: Francotyp-Postalia AG & Co. KG, Birkenwerder (DE)

( * ) Notice: Subject to any disclaimer, the term of this patent is extended or adjusted under 35 U.S.C. 154(b) by 348 days.

This patent is subject to a terminal disclaimer.

(21) Appl. No.: 10/961,943

(22) Filed: Oct. 8, 2004

(65) Prior Publication Data

US 2005/0058494 A1    Mar. 17, 2005

Related U.S. Application Data

(62) Division of application No. 10/103,374, filed on Mar. 21, 2002, now Pat. No. 6,821,040.

(30) Foreign Application Priority Data

Mar. 21, 2001   (DE)   ................................ 101 14 528

(51) Int. Cl.
    *B41J 29/12*   (2006.01)
(52) U.S. Cl. ...................................... 400/691; 400/693
(58) Field of Classification Search ..................... None
    See application file for complete search history.

(56) References Cited

U.S. PATENT DOCUMENTS

| | | | | |
|---|---|---|---|---|
| 4,340,809 A | * | 7/1982 | Betcher | ....................... 235/101 |
| 4,507,744 A | * | 3/1985 | McFiggans et al. | ......... 361/684 |
| 5,093,560 A | * | 3/1992 | Abellana | ..................... 235/101 |
| 5,389,863 A | * | 2/1995 | Fluckiger | .................... 318/549 |
| 5,493,279 A | * | 2/1996 | Dawson et al. | ............ 340/5.32 |
| 5,689,098 A | | 11/1997 | Gillieron | ..................... 235/101 |
| 6,087,603 A | | 7/2000 | Hecht et al. | ................. 200/246 |
| 6,601,443 B1 | | 8/2003 | Stumpe et al. | ............. 73/118.1 |

FOREIGN PATENT DOCUMENTS

| | | |
|---|---|---|
| DE | 1 835 063 | 7/1961 |
| DE | 196 23 615 A1 | 12/1997 |
| DE | 44 31 281 A1 | 3/1998 |
| DE | 297 04 128 U1 | 8/1998 |
| EP | 1 024 682 A2 | 8/2000 |

* cited by examiner

*Primary Examiner*—Anthony H. Nguyen
(74) *Attorney, Agent, or Firm*—Laurence A. Greenberg; Werner H. Stemer; Ralph E. Locher

(57) ABSTRACT

A secure housing for an electronic unit, in particular a franking machine has a first housing part and a second housing part releasably connected to the first housing part via at least one connecting device. In order to prevent the housing from being opened without leaving trace of the opening, there is provided at least one covering device on and/or in the first or second housing part. The covering device blocks the access to the connecting device and can only be removed from the first or second housing part with noticeable damage being caused.

19 Claims, 3 Drawing Sheets

SECURE HOUSING FOR AN ELECTRONIC UNIT

CROSS-REFERENCE TO RELATED APPLICATION

This is a division of application Ser. No. 10/103,374, filed Mar. 21, 2002 now U.S. Pat. No. 6,821,040; the application also claims the priority, under 35 U.S.C. §119, of German patent application No. 101 14 528.4, filed Mar. 21, 2001; the prior applications are herewith incorporated by reference in their entirety.

BACKGROUND OF THE INVENTION

Field of the Invention

The present invention relates to a secure housing for an electronic unit, in particular a franking machine. The secure housing has at least a first housing part and a second housing part, which is connected releasably to the first housing part via at least one connecting device.

Numerous electronic units or devices require their internals to be protected against unauthorized access in order, on the one hand, to protect the user against possible risk or else also to prevent fraudulent manipulation of the unit. This prevention of undetected fraudulent manipulation is particularly important precisely in franking machines which, ultimately, produce an imprint corresponding to a monetary value, namely the franking of a letter or the like.

In order to protect the mail carrier against relatively large losses which may result from fraudulent manipulation, for example of the postal registers of the franking machine, which contain the accounting information for the franking imprints produced by the franking machine, franking machines or the associated accounting module usually have/has a secure housing of the generic type. The secure housing prevents the unauthorized access to regions of the franking machine which need to be secured. It goes without saying here that, although a defrauder can gain access to these regions which need to be secured, there are nevertheless indications on the housing, or parts connected thereto, which indicate that an attempt has been made to gain access, with the result that there is evidence of an attempted deception at least after the fact.

In order to render the unauthorized opening, or even an attempt at unauthorized opening, of the secure housing detectable, it is known to use, for example, conventional wire seals by means of which at least one screw connecting the two housing parts is leaded in a known manner. The solution, however, has the disadvantage that the wire seals involve relatively high outlay and/or are unwieldy and, in some cases, may also be damaged accidentally, for example during changeover of the set-up location of the unit.

It has also become known, for example in the case of devices for recording heating costs, to use pin-like connecting elements for connecting the housing parts. The connecting elements have to be destroyed in order to release the connection between the two housing parts. These variants, in turn, have the disadvantage that, on account of the configuration of the connecting pins, they are usually only suitable for relatively small housings.

SUMMARY OF THE INVENTION

It is accordingly an object of the invention to provide a secure housing for an electronic device, which overcomes the above-mentioned disadvantages of the heretofore-known devices and methods of this general type and which, while being straightforward to produce, ensures that intentional manipulation is reliably detected.

With the foregoing and other objects in view there is provided, in accordance with the invention, a secure housing for an electronic unit, comprising:

a first housing part and a second housing part;

at least one connecting device for releasably connecting the first housing part with the second housing part;

at least one covering device configured to prevent the housing from being opened without being noticed, the covering device being disposed to block an access to the connecting device and being removable from the first or second housing part only with noticeable damage being caused.

The present invention is based on the technical teaching that a housing which is straightforward to produce and makes it possible for intentional manipulation to be reliably detected is obtained if, in order to prevent unknown opening of the housing, there is provided at least one covering device which is arranged on and/or in the first or second housing part, blocks the access to the connecting device and can only be removed from the first or second housing part with noticeable damage, for example at least partial destruction, being caused.

On the one hand, the covering device advantageously ensures that intentional manipulation of the housing is readily detectable. On the other hand, the covering device makes it possible for the connecting device to be configured in a conventional manner, with the result that no significant outlay has to be provided for this purpose, which, in turn, has an advantageous effect on the production outlay, in particular the production costs.

The covering device also has the advantage that it may be of relatively small and straightforward design, since all that it has to do is to block the access to the connecting device. This facilitates to a considerable extent the production both of the covering device and of the first and second housing parts.

The connecting device may be designed in a conventional manner, for example in the form of one or more screws, hooks, etc. via which the two housing parts are connected in a conventional manner. In the case of the screw, the covering device then needs merely, for example, cover the screw head, which is otherwise accessible for release purposes, and, accordingly, may be of very small, straightforward and compact configuration.

In the case of preferred variants of the housing according to the invention, it is provided that the connecting device comprises fastening means via which it is fastened releasably on the first housing part. It is thus advantageously possible to provide connecting devices in the case of which the connection between the first and second housing parts is possible, during the production of the unit, via a connecting mechanism which is more straightforward to join than that of the connection between the connecting device and the first housing part.

In the case of preferred variants of the housing according to the invention, it is provided that the connecting device is designed in the manner of a snap-in connection. In this case, a constituent part of the snap-in connection is then fastened on the first housing part via the fastening means. This connection may take place long before the rest of the unit is installed, with the result that, in order to complete the unit, following installation of the internals of the unit, all that is still required is for the second housing part to be placed in position and attached via the snap-in connection.

It goes without saying, however, that the constituent parts of the snap-in connection may each be fixedly connected to the associated housing part and the covering device then merely blocks the access by way of the first or second housing part to at least one of these constituent parts, via which, if appropriate using corresponding tools, the connection between the two housing parts can be released.

The covering device may be connected to the first housing part in any desired manner such that, upon removal from the first housing part or attempted removal therefrom, it is noticeably damaged, i.e. at least partially destroyed or impaired such that this is readily detectable at least to an experienced observer. For this purpose, the covering device may be integrally connected, e.g. welded, to the first housing part or connected thereto with a force fit, e.g. adhesively bonded thereto.

In the case of variants of the invention which are preferred because the noticeable destruction or damage is most easily ensured, the covering device is connected with a form fit to the first housing part. The covering device is further preferably connected to the first housing part via a snap-in connection which can only be released with at least partial destruction being caused. This variant has the advantage that, in addition, the connection to the first housing part can be produced particularly straightforwardly.

It is understood, in addition, that the above-mentioned types of connection between the covering device and the first housing part may also, of course, be combined with one another in any desired manner.

In the case of favorable developments of the housing according to the invention, the connecting device comprises at least one first connecting element, which is connected releasably to the first housing part, and at least one second connecting element, which interacts with the first connecting element and is arranged on the second housing part. This makes it possible to realize in a particularly straightforward manner the abovementioned connections between the first and second housing parts, the connections utilizing, during the production of the unit, a connecting mechanism which is more straightforward to join than that between the first connecting element and the first housing part. In this way, the connecting device may be designed, for example, simply in the manner of the abovementioned snap-in connection. It goes without saying here, of course, that it is also possible for the two connecting elements to be connected releasably to the respective housing part in an appropriate manner.

On account of being straightforward to realize, the first connecting element is preferably designed in the manner of a hook which engages in an undercut of the second connecting element in order to produce the connection between the first and second housing parts. In order to produce a connection designed in the manner of a snap-in connection, at least the first connecting element is further preferably designed in a resilient manner and, in addition or alternatively, is arranged in a correspondingly resilient manner, for example is fastened, for example, on a resilient section of the relevant housing part or is fastened there by a corresponding resilient element.

It goes without saying that the above-mentioned connections between the first and second housing parts, once the covering element has been fitted, are designed and arranged such that they can only be released again when the covering element is removed.

This may preferably be realized in that the connecting device is arranged straightforwardly within the housing.

It is also possible, however, for the connecting device to be arranged outside the housing, in which case the covering element is dimensioned and designed such that it covers at least all the regions of the connecting device via which the connection could be released. The covering element is preferably dimensioned and designed here such that it covers the entire connecting device and thus protects the latter against unauthorized access.

In the case of variants of the housing according to the invention which are preferred because they are particularly straightforward and reliable, the fastening means comprise a screw-connection. On account of the usually very robust construction, this additionally ensures that the connection between the two housing parts can be released a number of times, for example for authorized, routine maintenance or testing of the unit, without the functional capability of the connecting device being impaired as a result.

It may be sufficient to provide one of the above-mentioned connecting devices on or in the housing. In the case of particularly preferred variants of the housing according to the invention, however, two or more of the connecting devices described are provided. This makes it possible to realize housing parts which are particularly straightforward to assemble.

The present invention also relates to an electronic unit or device, in particular a franking machine, having a corresponding housing according to the invention, since in this case the above-described advantages can be achieved to particular effect.

With the above and other objects in view there is also provided, in accordance with the invention, a secure housing for an electronic unit, such as a franking machine, comprising:

a first housing part, a second housing part, and at least one connecting device for releasably connecting the first housing part with the second housing part;

a magnetic element carried by the first and/or second housing parts and a sensing element for sensing a change in a magnetic field generated by the magnetic element; and a memory connected to the sensing element for receiving a signal from the sensing element.

This further variant of the invention, which may possibly be used in addition to the above-described variants, straightforwardly ensures that the housing cannot be opened without this being noticed. Here, a magnetic element is disposed on a housing part and a sensing element is provided for sensing a change in the magnetic field in the region of the unit. The sensing element is connected to a memory of the unit and/or a processing device of the unit for receiving the signals from the sensing element.

This makes it possible to sense the removal of the housing part on which the magnetic element, for example, a straightforward permanent magnet, is arranged, since there is a change in the magnetic field in the region of the unit. This operation of sensing a change in the magnetic field corresponding to the removal of the housing part may then be registered by or in the processing device of the unit or by writing to the memory and, at a later point in time, for example during an inspection or the like, ascertained and, in addition, or alternatively, displayed of its own accord.

In addition or alternatively, of course, upon occurrence of the change in the magnetic field which corresponds to the removal of the housing part, and thus upon occurrence of a corresponding sensing signal from the sensing element, it may be provided that the unit is moved into a certain operating state, preferably into a blocking state, which the user cannot leave again without corresponding authorization.

The magnetic element and the sensing element are coordinated with one another so as to produce a change in the magnetic field which can be sensed by the sensing element. By virtue of a suitable selection of the magnetic element, the change in the magnetic field is preferably characteristic, such that the change can be reliably distinguished from other changes in the magnetic field in the region of the unit which may occur during normal operation of the unit.

The sensing element is preferably coordinated here such that it only emits a corresponding sensing signal to the memory and/or the processing device when the characteristic change actually takes place, with the result that it is only this change which has to be sensed and there is no need for any further evaluation or further processing in the processing device or following read-out of the registered data which correspond to the registered changes in the magnetic field.

The sensing element is preferably accommodated on the main board of the unit since it can thus easily be connected to the processing device and/or the memory. This sensing element is preferably a so-called reed switch.

Other features which are considered as characteristic for the invention are set forth in the appended claims.

Although the invention is illustrated and described herein as embodied in a secure housing for an electronic unit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
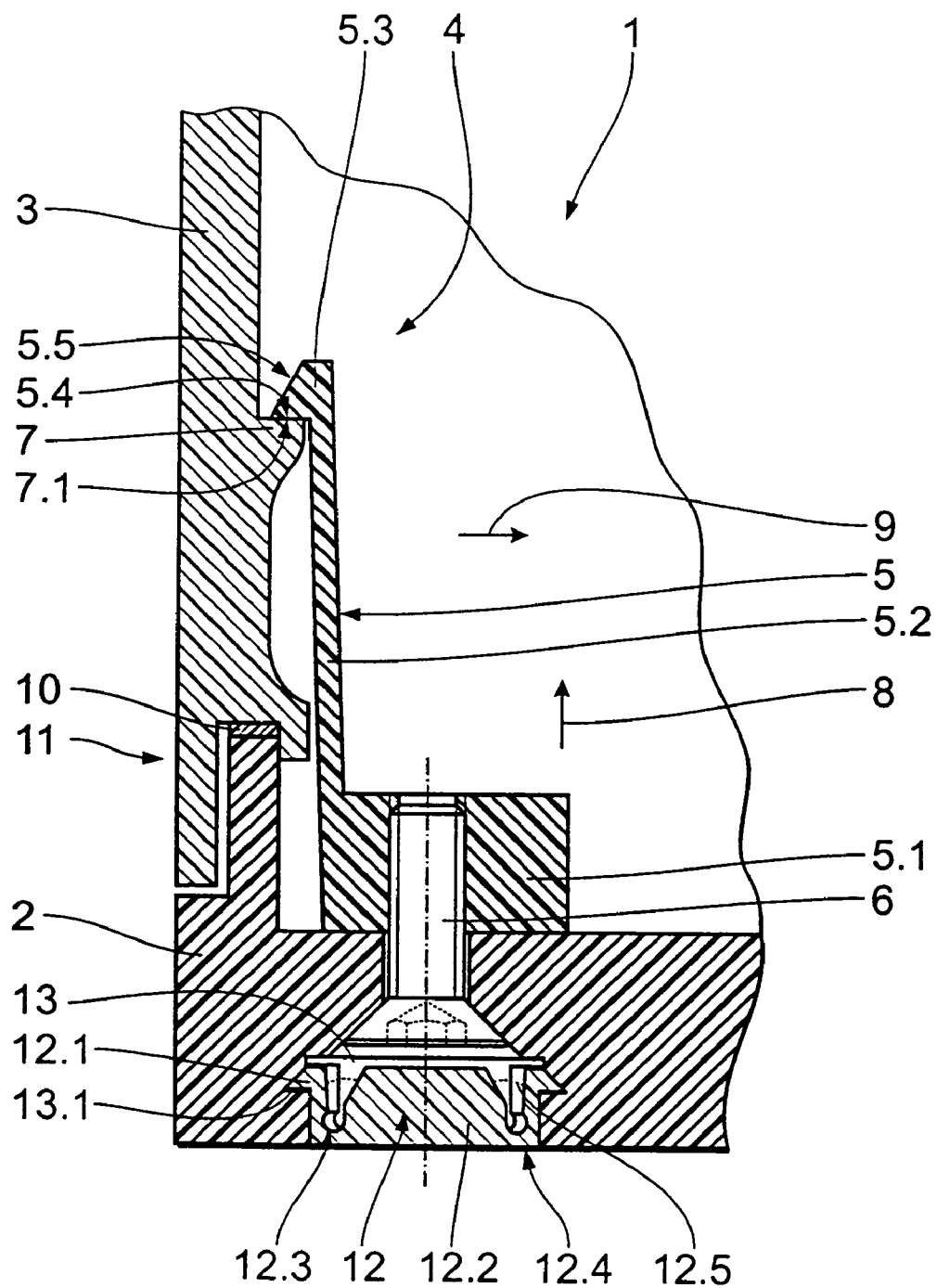
FIG. 1 is a section taken through part of a preferred configuration of the housing according to the invention.

Referring now to the figures of the drawing in detail and first, particularly, to FIG. 1 thereof, there is shown a schematic section through part of the preferred configuration of the housing 1 according to the invention of a franking machine. The housing has a first housing part 2 and a second housing part 3. The two housing parts 2, 3 are connected to one another via a connecting device 4 arranged in the interior of the housing 1.

The connecting device 4 is configured as a snap-in connection. It comprises a first connecting element 5, which is fastened on the first housing part 2 via a fastening means in the form of a fastening screw 6, and a second connecting element 7.

The first connecting element 5 is configured as a hook. For this purpose, it has a base element 5.1 into which the fastening screw 6 is screwed. Starting from this base element, a connecting arm 5.2 extends in a first direction 8, said arm having a first, hook-like shoulder 5.4 arranged at its free end 5.3.

In order to produce the connection between the two housing parts 2 and 3, this first shoulder 5.4 interacts with a corresponding undercut of the second connecting element 7 in the form of a second shoulder 7.1 integrally formed on the second housing part 3. The active surfaces of the two shoulders 5.4 and 7.1 run perpendicularly to the first direction 8, as a result of which they lock the two housing parts 2 and 3 in relation to one another in this direction.

The connecting arm 5.2 is formed from a sufficiently elastic material, with the result that it can move resiliently, transversely to the first direction, along a second direction 9.

When the two housing parts 2 and 3 are joined together counter to the first direction 8, the connecting arm 5.2, as a result of contact made with its run-on surface 5.5 which is inclined in relation to the first direction, is deflected in the second direction before it finally snaps back, at the end of the joining operation, into the position shown.

The connecting arm 5.2 is designed such that, in the state shown, it is prestressed against the second shoulder 7.1 counter to the second direction 9. As a result, unintended release of the connection cannot take place.

Along the first direction, there is prestressing between the two shoulders 5.4 and 7.1 resulting from the elastic restoring forces of an elastic intermediate layer 10 between the two housing parts 2 and 3. On the one hand, this intermediate layer ensures play-free connection between the housing parts 2 and 3 and, on the other hand, it allows a straightforward latching-in action of the snap-in connection since the two housing parts 2 and 3, by virtue of their elastic deformability, when joined together, can initially be moved towards one another counter to the first direction 8 to a greater extent than is illustrated.

The fixing of the two housing parts 2 and 3 along the second direction 9 is ensured by an overlap 11, which additionally ensures that no gap is produced through which penetration into the interior of the housing 1 can take place.

In order to ensure that the housing 1 cannot be opened by unauthorized persons without this being detected, the access to the head of the fastening screw 6 is blocked by a covering device in the form of a covering disk 12 which is inserted into a recess 13 in the first housing part 2.

This covering disk 12 can only be removed from the recess 13 by being at least visibly damaged. It is usually destroyed in the process. In order to ensure this, the covering disk 12 has, on its circumference, resilient barbs 12.1 which latch, under prestressing, into corresponding undercuts 13.1 of the recess 13. These barbs 12.1 have weakening regions 12.3 at their transition to the basic body 12.2 of the covering disk 12. On the one hand, these weakening regions 12.3 allow or facilitate the resilience of the barbs 12.1. On the other hand, they ensure that, on removal of the covering disk 12 from the recess 13, one or more of the barbs 12.1 tear off from the basic body 12.2, this causing noticeable damage to the covering disk 12.

The surface 12.4 of the covering disk 12 terminates flush with the first housing part 2, with the result that the risk of unintended damage to the covering disk 12 is vastly reduced in a straightforward manner. In order to reduce this risk further still, it is also possible, in other variants, for the covering disk to be sunken in the first housing part.

The surface 12.4 of the covering disk 12 is smooth, i.e. designed without undercuts or protrusions, with the result that it does not provide any point of attachment for a tool for removal purposes. This ensures that, in order to remove the covering disk 12 from the recess 13, for lack of other points of attachment, an appropriate tool usually has to be used to pierce the covering disk 12 in order to provide a point of attachment. Of course, this likewise causes noticeable damage to the covering disk 12.

It goes without saying, however, that, in the case of other variants of the invention, it is also possible to provide an appropriate undercut or the like at the point of attachment for a tool for the purpose of removing the covering disk.

The above-described configuration of the covering disk should be sufficient in order reliably to thwart the majority of attempted deceptions, or at least in order not to leave them unnoticed. In order to reduce still further the probability of the covering disk 12 being removed from the recess 13 without being detected, it is possible, in the case of further variants of the invention, also to make provisions for at least the regions between the barbs 12.1 of the covering disk 12 and the base body 12.2 of the covering disk 12 to be wholly or partially filled with a hardening compound prior to insertion of the covering disk 12, or through a corresponding opening in the covering disk, as is indicated by the contour 12.5, in order thus to prevent the barbs 12.1 from subsequently springing back and the covering disk 12 thus being released by appropriate tools introduced into the gap between the covering disk 12 and the housing 1. It is also possible, if appropriate, for all of the space still remaining in the recess 13 to be filled.

In order to release the connection between the two housing parts 2 and 3, for example for inspection or maintenance purposes, it is necessary first of all to remove the covering disk 12, in which case the latter is at least visibly damaged. It is then possible for the fastening screw 6 to be released, as a result of which the connection between the two housing parts 2 and 3 is also released and the second housing part 3 can be lifted off from the first housing part 2 in the first direction 8.

In the case of the housing 1 shown, a plurality of such connecting devices 4 are provided, with the result that this procedure has to take place for all of these connecting devices 4 before the two housing parts 2 and 3 can be separated from one another.

It goes without saying that, in the case of other variants of the housing according to the invention, it is also possible for a plurality of connecting arms of the first connecting element to be arranged on a common base element. This base element may then, in turn, also be fastened on the first housing part by a plurality of fastening elements. It is further possible to provide a covering device for a plurality of fastening elements.

Figure 2:
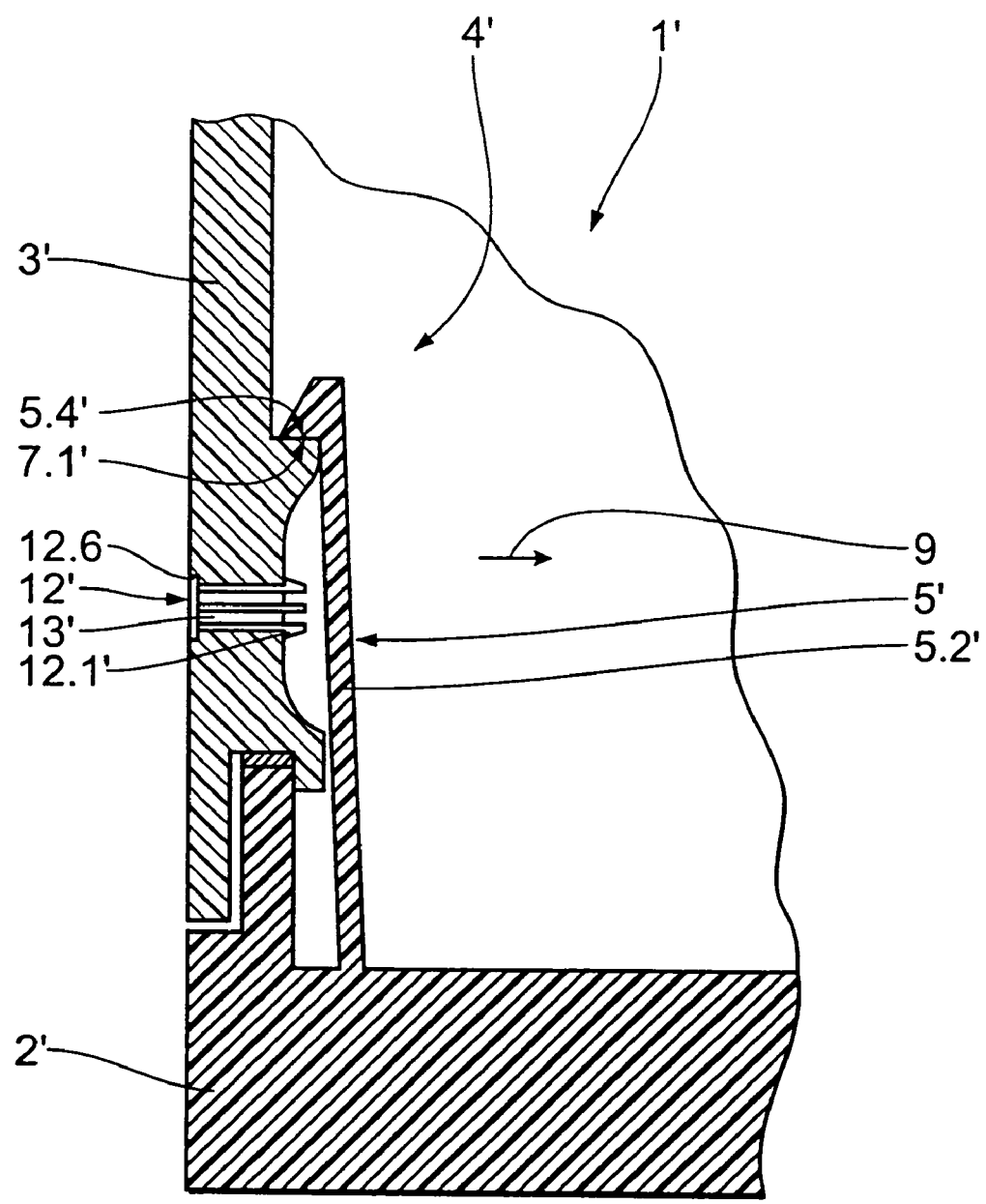
FIG. 2 is a section taken through part of a further preferred configuration of the housing according to the invention.

FIG. 2 shows a schematic section through part of a further preferred configuration of the housing 1' according to the invention of a franking machine. This configuration basically corresponds, in terms of its construction and functioning, to that from FIG. 1, so only the differences will be discussed here.

The difference is that the resilient connecting arm 5.2' of the first connecting element 5' of the connecting device 4' is fixedly connected to the first housing part 2', in the presence case integrally formed on the first housing part 2'.

In order to release the connection between the first housing part 2' and the second housing part 3', an opening 13' is provided in the second housing part 3', through which opening it is possible to guide a tool—not illustrated—in order to remove the connecting arm 5.2' from the second housing part 3' in the second direction 9 and thus to release the engagement between the first shoulder 5.4' and the second shoulder 7.1'.

This opening 13' is closed by a covering device in the form of a cover 12' with resilient barbs 12.1'. This cover 12', in turn, can only be removed by being at least visibly damaged, but usually destroyed. The release of the cover 12' by the barbs 12.1' springing back using appropriate tools introduced into the gap between the cover 12' and housing 1' is prevented here by the shoulder 12.6 of the cover 12'.

Figure 3:
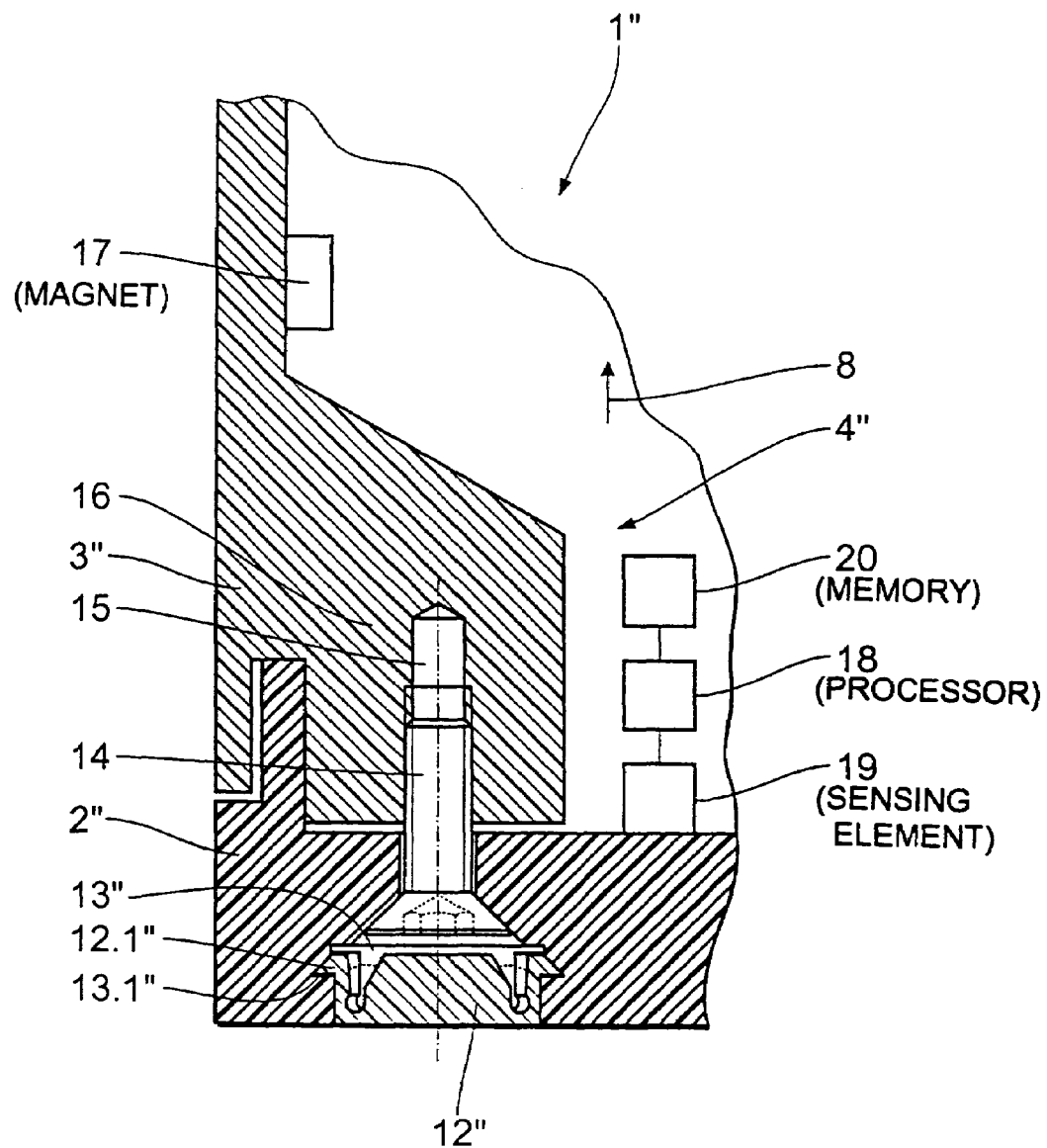
FIG. 3 is a section taken through part of a third preferred configuration of the housing according to the invention.

FIG. 3 shows a schematic section through part of yet a further preferred configuration of the housing 1" according to the invention of a franking machine.

In the case of this configuration, the connecting device 4" is formed by a straightforward screw-connection in the case of which a connecting screw 14, as a first connecting element, is screwed into the threaded bore 15 of a protrusion 16 on the second housing part 3", as a second connecting element.

In order to ensure that the housing 1" cannot be opened by unauthorized persons without this being detected, the access to the head of the fastening screw 14 is blocked by a covering device in the form of a covering disk 12" which is inserted into a recess 13" in the first housing part 2".

This covering disk 12" can only be removed from the recess 13" by being at least visibly damaged. It is usually destroyed is the process. In order to ensure this, the covering disk 12" has, on its circumference, resilient barbs 12.1" which latch, with prestressing, into corresponding undercuts 13.1" of the recess 13".

In order to release the connection between the two housing parts 2" and 3", for example for inspection or maintenance purposes, it is necessary first of all to remove the covering disk 12", in which case the latter is at least visibly damaged. It is then possible to release the fastening screw 14, as a result of which the connection between the two housing parts 2" and 3" is also released and the second housing part 3" can be lifted off from the first housing part 2" in the first direction 8.

As a further means of securing against the housing 1" being opened without this being noticed, a magnetic element in the form of a permanent magnet 17 is arranged on the second housing part 3", as is also a sensing element which is connected to the central processing device 18 of the franking machine 1" and is in the form of a reed switch 19. This reed switch 19 is arranged, like the processing device 18, on the first housing part 2" and senses a change in the magnetic field in the region of the franking machine 1".

In the case of a change in the magnetic field which corresponds to the second housing part 3" provided with the magnet 17 being removed from the first housing part 2", the reed switch 19 emits a corresponding signal to the processing device 18. This processing device 18 registers this signal and files corresponding information in a memory 20 which is connected to said processing device and, at a later point in time, for example upon inspection or connection to a remote data center, is read out, as a result of which the opening of the housing can then be detected.

It goes without saying that, in the case of other variants, it may also be provided that, upon occurrence of the change in the magnetic field which corresponds to the removal of the second housing part, and thus upon occurrence of a corresponding sensing signal from the reed switch, the franking machine is moved into a certain operating state, preferably into a blocking state, which the user cannot leave again without corresponding authorization.

The field strength of the magnet 17 is coordinated with the reed switch 19 such that movement of the magnet 17 relative to the reed switch 19 produces such a characteristic change in the magnetic field that this change can be reliably distinguished from other changes in the magnetic field in the region of the franking machine 1″ which may occur in normal operation of the unit.

The reed switch 19 is coordinated here such that it only emits a corresponding sensing signal to the processing device 18 when the above-described characteristic change actually takes place, with the result that it is only this change which is sensed and transmitted.

It goes without saying that, in the case of other variants of the sensing element, the changes which it senses can simply be transmitted to the processing device. The evaluation as to whether a characteristic change has taken place may then be carried out by the processing device of the franking machine or, following read-out of the registered data, in an external device.

The reed switch 19, together with the processing device 18 and the memory 20, is accommodated on the main board—not illustrated—of the franking machine 1″, since they can easily be connected to one another as a result. It goes without saying, however, that, in the case of other variants of the invention, it may also be arranged at any other desired location. All that has to be ensured is that it is arranged on a part of the franking machine which, upon removal of the housing part with the magnet, is not moved along with this housing part.

Although the invention has been described in conjunction with franking machines in all of the above examples of preferred configurations, it goes without saying, however, that it can also be used in conjunction with any other desired units, in particular electronic units.

We claim:

1. A secure housing for an electronic unit, comprising:
   a first housing part and a second housing part;
   at least one connecting device for releasably connecting said first housing part with said second housing part;
   a magnetic element carried by one of said first and second housing parts;
   a sensing element for sensing a change in a magnetic field generated by said magnetic element; and
   a memory connected to said sensing element for receiving a signal from said sensing element.

2. The housing according to claim 1, which further comprises a processing device connected to said sensing element.

3. The housing according to claim 1, wherein said magnetic element is carried by said one of said first and second housing parts and said sensing element is carried by a different one of said first and second housing parts.

4. The housing according to claim 1, wherein said magnetic element is a permanent magnet.

5. The housing according to claim 1, which further comprises a covering device disposed on one of said first and second housing parts.

6. The housing according to claim 1, which further comprises a covering device disposed on at least one of said first and second housing parts.

7. The housing according to claim 1, wherein said first and second housing parts together form a housing for a franking machine.

8. The housing according to claim 1, wherein said connecting device includes a fastener releasably fastenable on said first housing part.

9. The housing according to claim 1, wherein said connecting device is configured as a snap-in connector.

10. The housing according to claim 1, which further comprises a covering device connected to one of said first and second housing parts via a snap-in connection releasable only with noticeable damage being caused.

11. The housing according to claim 1, wherein said first connecting device is configured with a first connecting element having a hook for engaging into an undercut of a second connecting element to produce the releasable connection between said first and second housing parts.

12. The housing according to claim 11, wherein said first connecting element, in order to produce a snap-in type connection, is configured to be tamper resistant.

13. The housing according to claim 1, wherein said connecting device is disposed within the housing.

14. The housing according to claim 1, wherein said at least one connecting device includes a screw-connection fastener.

15. In combination with an electronic device, the secure housing according to claim 1.

16. The housing according to claim 2, wherein said processing device is configured, upon sensing a change in the magnetic field, to move the electronic unit into a certain operating state, during which the user cannot leave the certain operating state without a corresponding authorization.

17. The housing according to claim 16, wherein the certain operating state is a blocking state preventing unauthorized operation of the electronic unit.

18. The housing according to claim 1, wherein said magnetic element and said sensor element are calibrated with regard to a magnetic field strength to permit a removal of said magnetic element to be reliably distinguished from other changes in the magnetic field in a region around the secure housing of the electronic unit that may occur during normal operation of the electronic unit.

19. The housing according to claim 1, wherein said sensor element is a reed switch.

* * * * *